US006886442B2

(12) United States Patent
Wu et al.

(10) Patent No.: US 6,886,442 B2
(45) Date of Patent: May 3, 2005

(54) PUNCHING APPARATUS FOR BACKING-FILMS OF CMP MACHINES AND PREVENTIVE MAINTENANCE METHOD FOR THE SAME

(75) Inventors: Wan-Yi Wu, Changhua Hsien (TW); Ming Fa Tsai, Panchiao (TW)

(73) Assignee: Nanya Technology Corporation, Taoyuan (TW)

( * ) Notice: Subject to any disclaimer, the term of this patent is extended or adjusted under 35 U.S.C. 154(b) by 178 days.

(21) Appl. No.: 10/142,374

(22) Filed: May 8, 2002

(65) Prior Publication Data

US 2003/0084997 A1 May 8, 2003

(30) Foreign Application Priority Data

Nov. 6, 2001 (TW) ....................................... 90127512 A

(51) Int. Cl.[7] ............................ B26D 1/00; C23F 1/00; H01L 21/306

(52) U.S. Cl. ............................ 83/684; 83/620; 83/651; 83/687; 83/691; 156/345.12; 156/345.14

(58) Field of Search ............................... 83/620, 639.1, 83/651, 684, 687, 691; 156/345.11, 345.12, 345.14

(56) References Cited

U.S. PATENT DOCUMENTS 4,235,089 A * 11/1980 Vecchi ........................ 72/472
5,303,618 A * 4/1994 Norell ........................ 76/107.1
6,006,636 A * 12/1999 Baldwin et al. ............... 83/13
6,062,120 A * 5/2000 Tsuzaki et al. .............. 83/76.1
6,119,555 A * 9/2000 DiMaria .................... 76/107.1
6,220,138 B1 * 4/2001 Sakamoto .................. 83/639.1
RE37,323 E * 8/2001 Kawamura et al. ......... 156/261
2003/0084997 A1 * 5/2003 Wu et al. .............. 156/345.12
2004/0154452 A1 * 8/2004 Wu et al. ...................... 83/651

FOREIGN PATENT DOCUMENTS

CN 1300661 A 6/2001
CN 2451257 Y 10/2001

* cited by examiner

*Primary Examiner*—Jeffrie R. Lund
(74) *Attorney, Agent, or Firm*—Ladas & Parry LLP

(57) ABSTRACT

An apparatus for punching CMP machine backing film. The apparatus comprises a base, a first plate, and a second plate. The base holds the backing-film. The first plate is disposed on the base in a manner such that it moves between a first position and a second position. The first plate abuts the backing-film when it is located at the second position. The second plate, having a plurality of punches, is disposed on the base in a manner such that it moves between a third position and a fourth position. The first plate is located at the first position when the second plate is located at the third position. The first plate is located at the second position when the second plate is located at the fourth position so that the punches pass through the first plate to punch the backing-film.

7 Claims, 15 Drawing Sheets

PUNCHING APPARATUS FOR BACKING-FILMS OF CMP MACHINES AND PREVENTIVE MAINTENANCE METHOD FOR THE SAME

BACKGROUND OF THE INVENTION

1. Field of the Invention

The invention relates to an apparatus for punching CMP machine backing film; in particular, to an apparatus that can punch the backing-film of the CMP machine with enhanced efficiency and simplified procedure.

2. Description of the Related Art

In the past years, chemical mechanical polishing (CMP) has emerged as a critical technology in the area of wafer planarization for companies that manufacture integrated circuit (IC) devices. FIG. 1 shows a schematic view of a CMP machine, wherein the CMP machine shown consists of a shaft 1, a top ring 4 disposed on the shaft 1, a polishing slurry-distributing system 3, a platform 2, and a polishing pad 5 disposed on the platform 2. In addition, a wafer 6 is held by the top ring 4.

FIG. 2*a* and FIG. 2*b* are schematic views of the top ring 4, wherein FIG. 2*a* shows a surface of the top ring 4 connected with the shaft 1 of the top ring 4. The top ring 4 comprises a body 41, a guide ring 42, and a cover 43, wherein a closed space is formed between the cover 43 and the body 41. By connecting a port 431 of the cover 43 with a pumping system (not shown), the wafer can be vacuum-fixed by air holes 411, referring to FIG. 3*f* and FIG. 3*g*, located in the top ring 4. The body 41 and the cover 43 are coupled by plural screws 44, whereas the body 41 and the guide ring 42 are coupled by plural screws 45.

FIG. 2*b* shows the other surface of the top ring 4, on the opposite side, in contact with the polishing pad 5. In FIG. 2*b*, the guide ring 42 is disassembled. A backing-film 7, without being drilled, is adhered to this surface. As shown in FIG. 2*c*, a surface of the backing-film 7 is provided with a sticker 71 such that the unused sticker 71 is covered by a paper 72 to protect the adhesive surface of the sticker 71.

The conventional procedures for changing a backing-film described in detail hereinafter are in reference to FIG. 3*a*, FIG. 3*b*, FIG. 3*c*, FIG. 3*d*, FIG. 3*e*, FIG. 3*f*, FIG. 3*g* and FIG. 3*h*. Firstly, as shown in FIG. 3*a*, the top ring 4 is disassembled from the shaft 1. Then, after the guide ring 42 and the cover 43 have been disassembled from the body 41, the used backing-film is removed from the top ring 4. Referring to FIG. 3*b*, a new backing-film 7 as shown in FIG. 2*c* is positioned upon the surface of the top ring 4 that is to be in contact with the polishing pad 5. The backing-film 7 is aligned with the top ring 4 afterwards, and a portion of the paper 72 is then peeled off from the sticker 71, as shown in FIG. 3*c*. FIG. 3*d* shows the process of adhering the backing-film 7 onto the top ring 4, wherein the backing-film 7 is adhered to the top ring 4 and smoothed out completely by means of a roller 8, as shown in FIG. 3*e*.

Referring to FIG. 3*f*, FIG. 3*g* and FIG. 3*h*, the process of drilling the backing-film 7 proceeds after the backing-film 7 is completely adhered to the top ring 4. Plural holes corresponding to the positions of the air holes 411 are manually drilled by means of a drill 9 with a 0.5 mm diameter. Then, the top ring 4 is turned upside down so as to re-drill the drilled holes from the other side by the drill 9 with a 0.7 mm diameter in order to smooth the drilled holes. The steps shown in FIG. 3*f*, FIG. 3*g* and FIG. 3*h* are repeated until all holes corresponding to the air holes 411 have been drilled. After the drilling process is completed, the guide ring 42 and the cover 43 are assembled to the body 41. The whole top ring 4 is then assembled to the shaft 1 to finish the backing-film replacement according to the conventional apparatus and method.

However, the conventional backing-film replacement has the following disadvantages:

1. The drilling process is typically difficult and laborious. Also, burr tends to be generated to cause an untrimmed edge of the drilled hole, which in turn may contribute to unstable and/or inefficient preventive maintenance (PM). As a result, the down time for the top-ring during a routine PM and QC (quality control) may prove to be long enough that productivity is affected.

2. The burr stated above can easily cause a bad finish on the wafer polishing or even the breakage of a wafer. Furthermore, the machine may be halted by such an error.

3. By means of the conventional backing-film replacement, it is difficult to locate the backing-film on the top ring.

4. Since the drills are expensive and easily damaged, the cost is increased.

SUMMARY OF THE INVENTION

In order to address the disadvantages of the aforementioned conventional backing-film replacement, the invention provides an apparatus for punching CMP machine backing film so that the backing-film replacement proceeds with enhanced efficiency and simplicity.

Accordingly, the invention provides an apparatus for punching CMP machine backing film. The apparatus comprises a base, a first plate, and a second plate. The base holds the backing-film. The first plate is disposed on the base in a manner such that it moves between a first position and a second position. The first plate abuts the backing-film when it is located at the second position. The second plate, having a plurality of punches, is disposed on the base in a manner such that it moves between a third position and a fourth position. The first plate is located at the first position when the second plate is located at the third position. The first plate is located at the second position when the second plate is located at the fourth position so that the punches pass through the first plate to punch the backing-film.

In a preferred embodiment, the first plate is provided with a plurality of lead holes corresponding to the punches of the second plate.

In another preferred embodiment, the base is provided with a concave portion for backing-film disposal thereupon.

In another preferred embodiment, the apparatus further comprises a cylinder, a plurality of main rods, and a plurality of connecting members. The cylinder, connecting with the second plate, moves the first plate and the second plate. The main rods, disposed on the base, are used for guiding the movement of the first plate and the second plate. The connecting members connect the first plate and the second plate in a manner such that the first plate moves relative to the second plate.

Furthermore, the first plate is provided with a plurality of first through holes. The second plate is provided with a plurality of second through holes corresponding to the first through holes. The main rods pass through the first through holes and the second through holes.

Furthermore, each of the connecting members is provided with an opening for connecting the first plate and the second plate.

Furthermore, the apparatus comprises a gas-supplying device, two buttons, and an actuating rod. The gas-supplying device communicates with the cylinder and supplies gas to the cylinder. The buttons are electrically coupled to the gas-supplying device. The gas-supplying device supplies gas to the cylinder when the buttons are actuated at the same time. The actuating rod connects the cylinder and the second plate.

In another preferred embodiment, this invention provides a preventive maintenance method for CMP machine backing film. The preventive maintenance method comprises the following steps. A punching apparatus is provided. The CMP machine is provided with a shaft and a detachable top ring disposed on the shaft. The top ring is provided with a plurality of air holes, a detachable guide ring, and a replaceable backing-film. The backing-film is pre-drilled by the punching apparatus to produce a plurality of holes that correspond to the air holes. The top ring is disassembled from the shaft before the preventive maintenance for the backing-film proceeds. The top ring is cleaned after disassembling the guide ring from the top ring and removing the used backing-film. The new backing-film is disposed on the top ring and the top ring is assembled to the shaft.

BRIEF DESCRIPTION OF THE DRAWINGS

The invention is hereinafter described in detail with reference to the accompanying drawings in which:

FIG. 3*a*, FIG. 3*b*, FIG. 3*c*, FIG. 3*d*, FIG. 3*e*, FIG. 3*f*, FIG. 3*g* and FIG. 3*h* illustrate steps in a conventional procedure for replacing a backing-film, wherein FIG. 3*g* shows a cross-section of FIG. 3*f;*

DETAILED DESCRIPTION OF THE INVENTION

Figure 1:
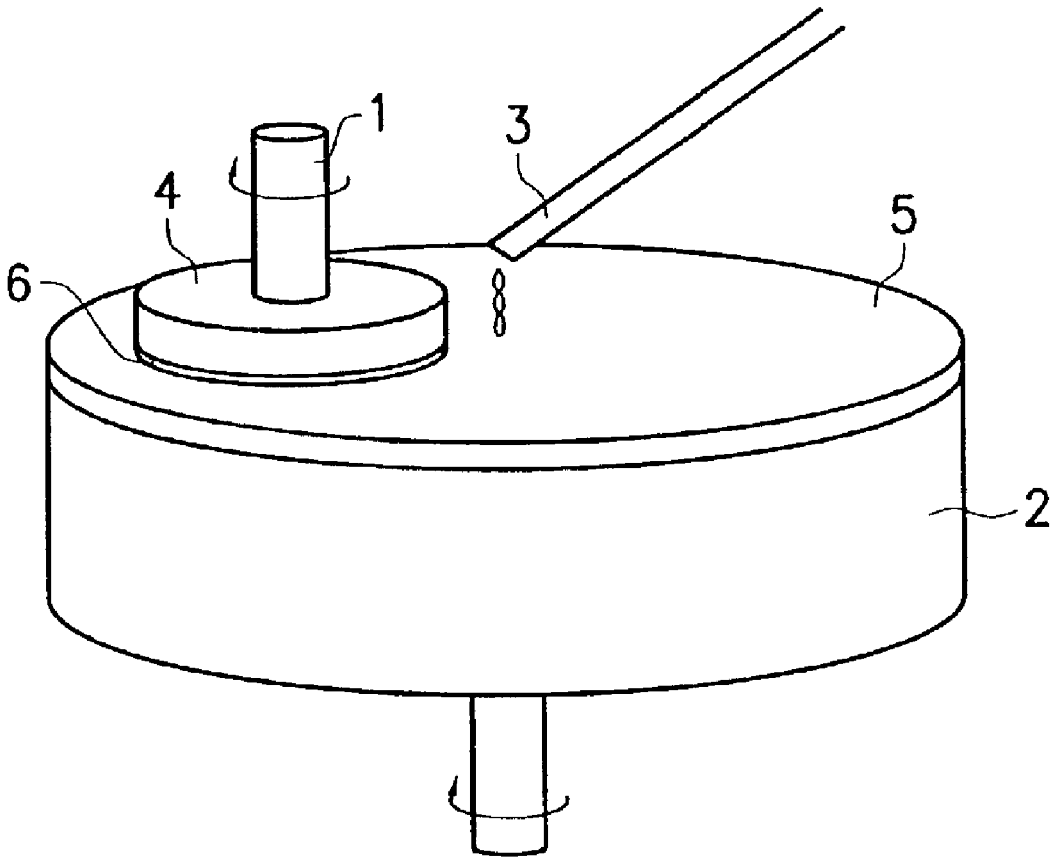
FIG. 1 (PRIOR ART)
FIG. 1 is a schematic view showing a CMP machine.
Figure 2A:
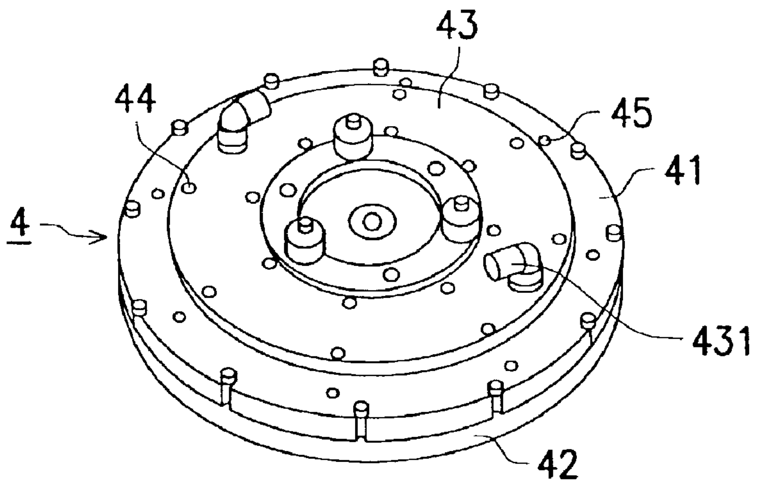
FIG. 2a (PRIOR ART)
FIG. 2*a*, FIG. 2*b* are schematic views showing a top ring, wherein a surface of the top ring that is to be coupled with a shaft is shown in FIG. 2*a*, and a surface of the top ring that is to be in contact with a polishing pad is shown in FIG. 2*b;*
Figure 2B:
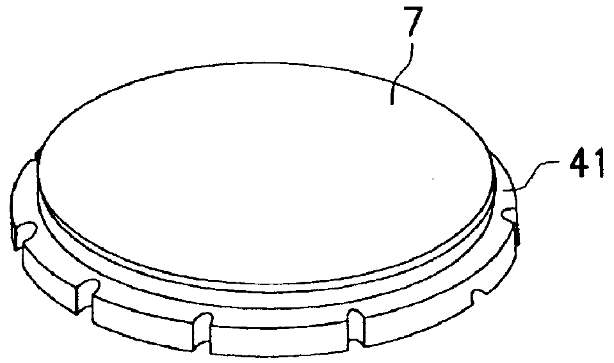
FIG. 2b (PRIOR ART)
Figure 2C:
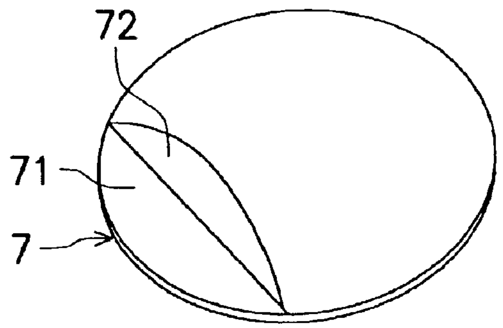
FIG. 2c (PRIOR ART)
FIG. 2*c* is a schematic view showing a new, unused backing-film.
Figure 3A:
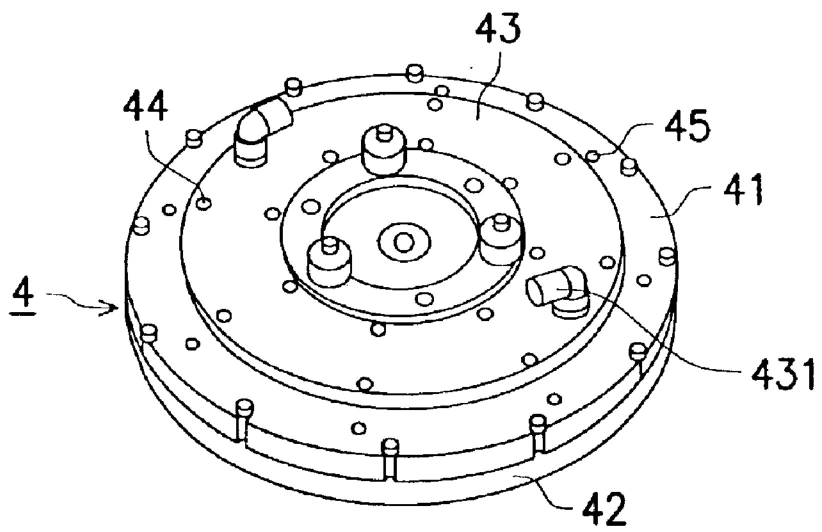
FIG. 3a (PRIOR ART)
Figure 3B:
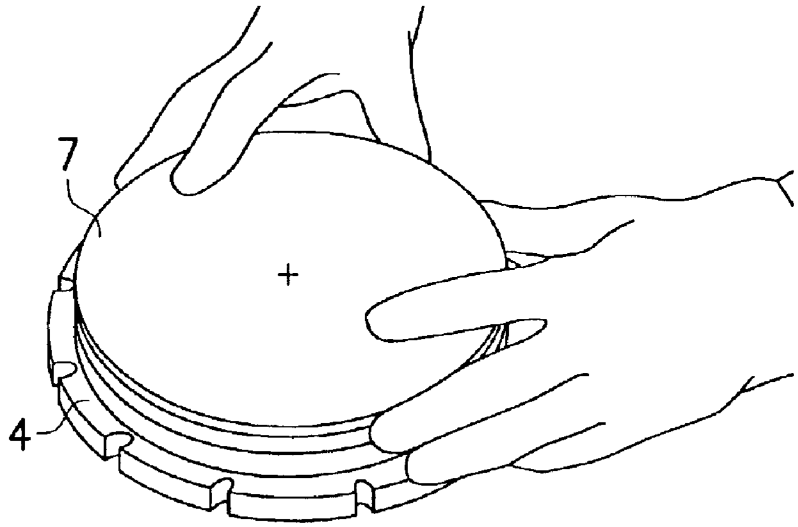
FIG. 3b (PRIOR ART)
Figure 3C:
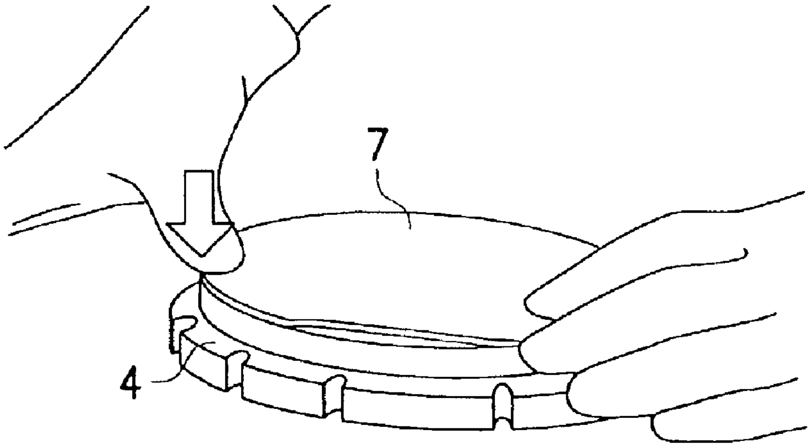
FIG. 3c (PRIOR ART)
Figure 3D:
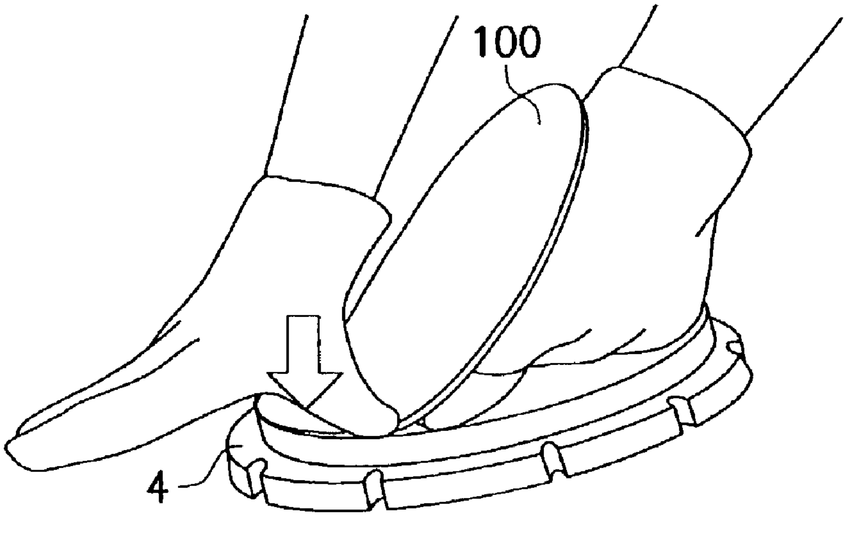
FIG. 3d (PRIOR ART)
Figure 3E:
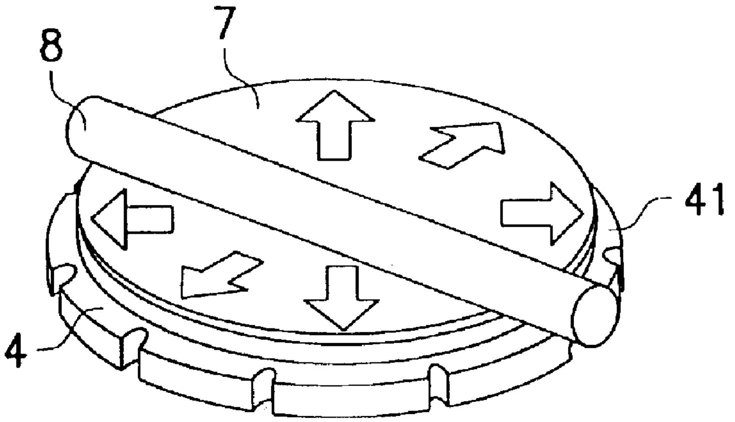
FIG. 3e (PRIOR ART)
Figure 3F:
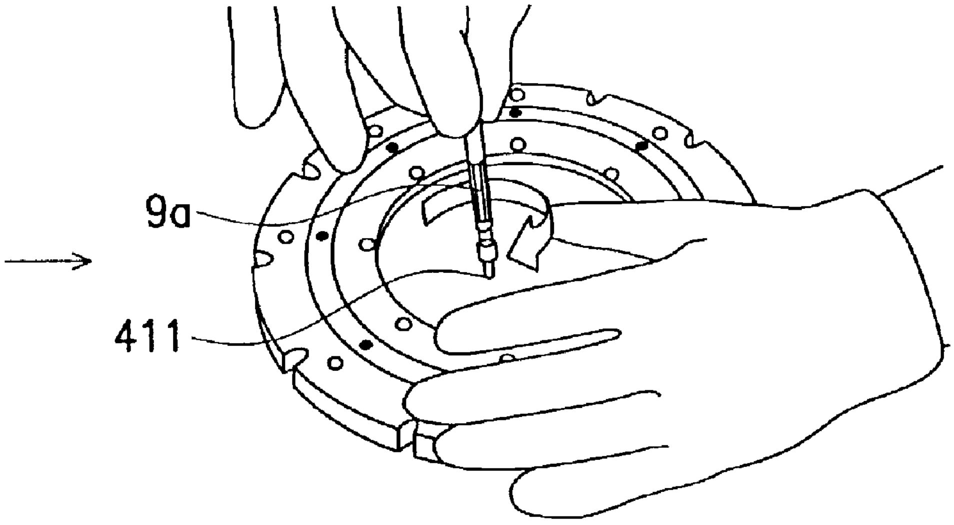
FIG. 3f (PRIOR ART)
Figure 3G:
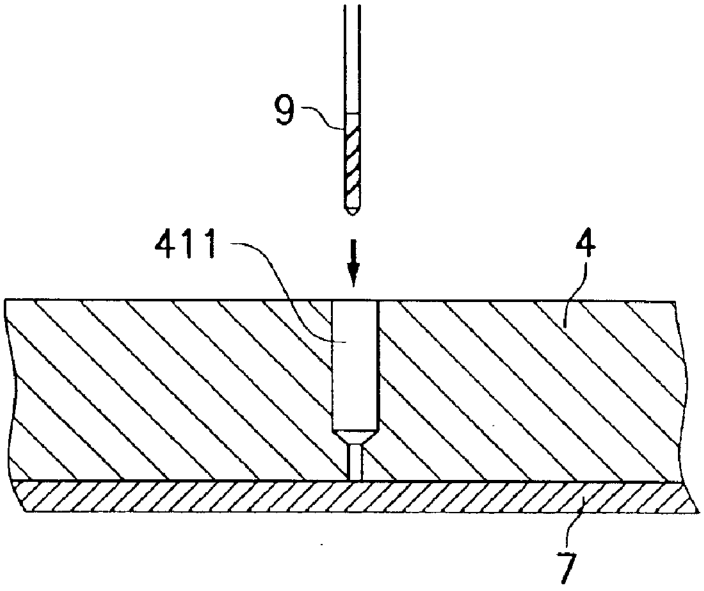
FIG. 3g (PRIOR ART)
Figure 3H:
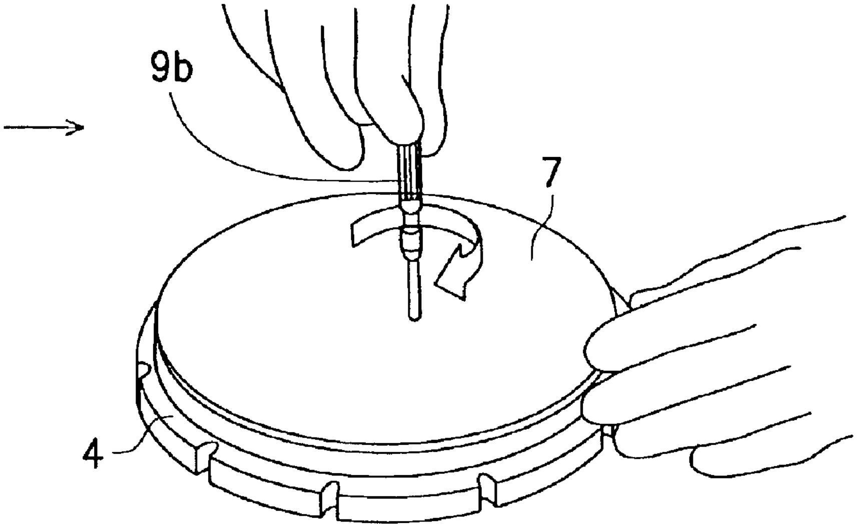
FIG. 3h (PRIOR ART)

Referring to FIG. 4, FIG. 5*a*, FIG. 5*b*, FIG. 5*c*, FIG. 5*d*, FIG. 6*a*, and FIG. 6*b*, an apparatus 200, for punching CMP machine backing film, of this invention is applied for punching the backing-film as shown in FIG. 2*c*. The CMP machine is shown in FIG. 1, FIG. 2*a*, and FIG. 2*b*, and its description is omitted.

Figure 4:
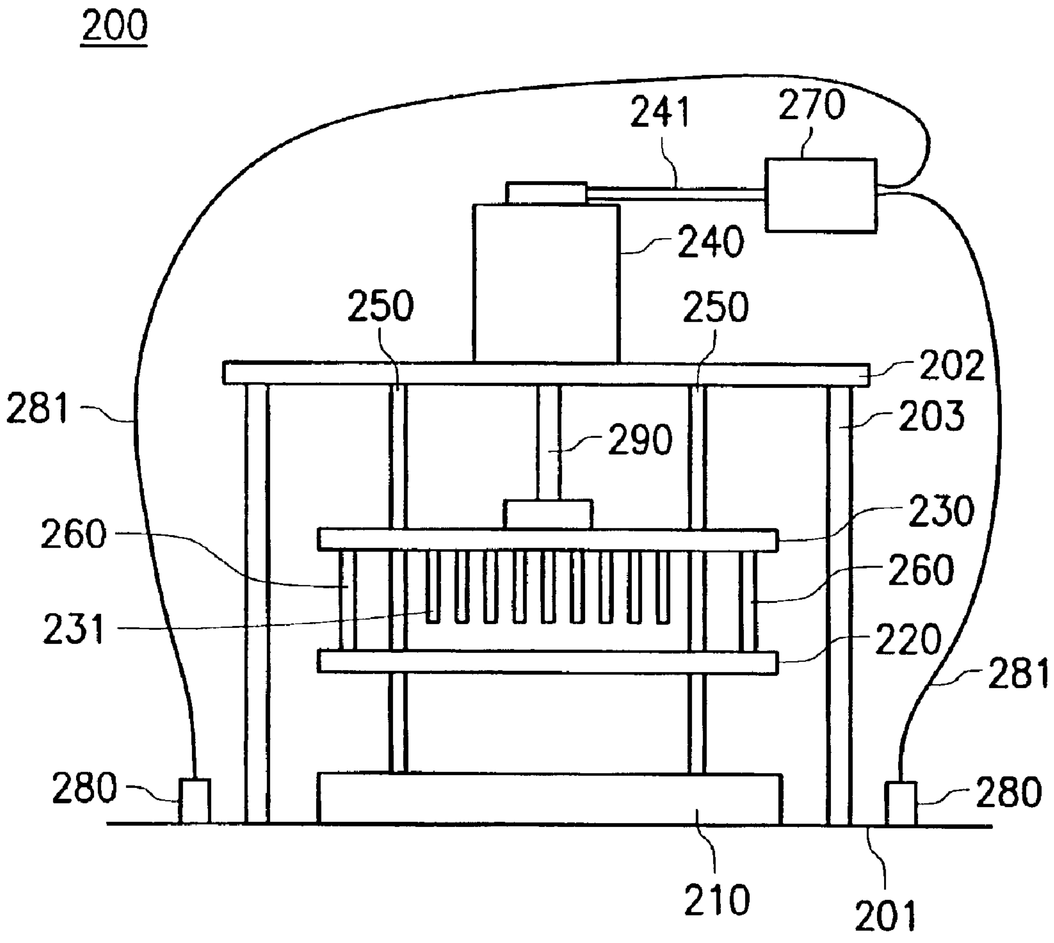
FIG. 4 is a front view depicting an apparatus, for punching CMP machine backing film, as disclosed in this invention, wherein a first plate is located at a first position, a second plate is located at a third position.
Figure 5A:
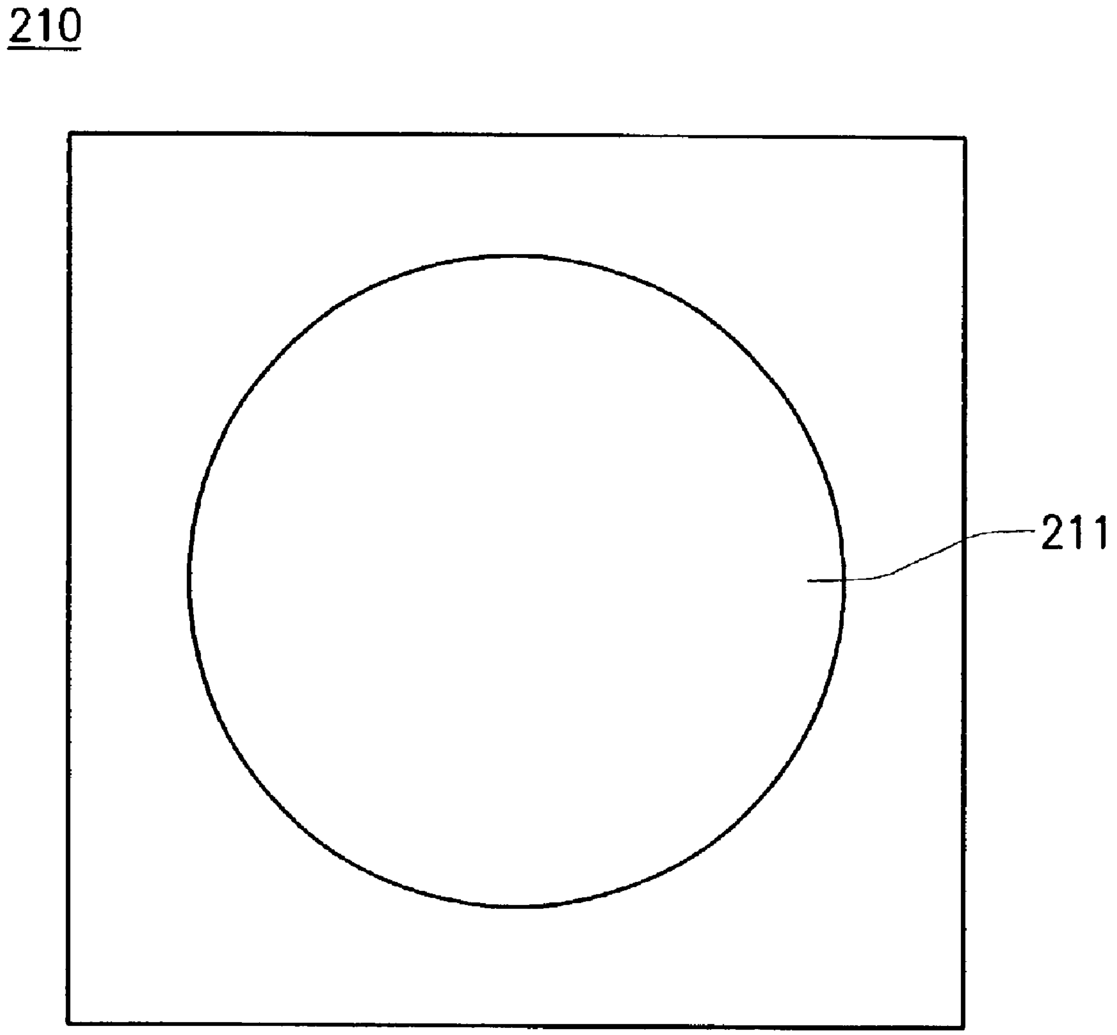
FIG. 5*a* is a top view depicting a base in FIG. 4.

As shown in FIG. 4, the punching apparatus 200 comprises a body 201, a platen 202, two supporting rods 203, a base 210, a first plate 220, a second plate 230, a cylinder 240, two main rods 250, two connecting members 260, a gas-supplying device 270, two buttons 280, and an actuating rod 290. The body 201, the platen 202, and the supporting rods 203 constitute a basic frame of the punching apparatus 200. The base 210 is disposed on the body 201, and is provided with a concave portion 211 as shown in FIG. 5*a*. The base 210 holds the backing-film by the concave portion 211.

Figure 5B:
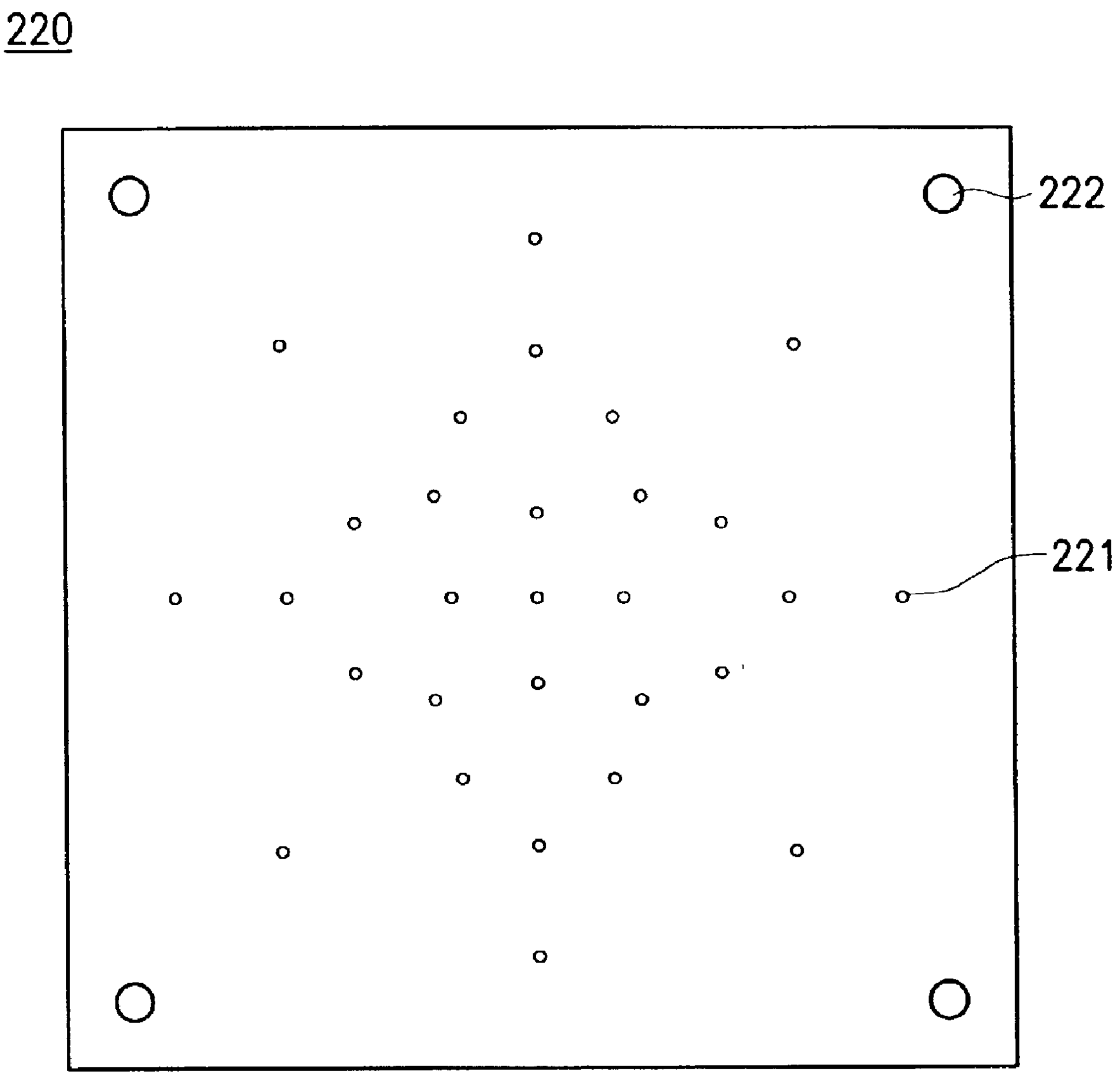
FIG. 5*b* is a top view depicting a first plate in FIG. 4
Figure 6A:
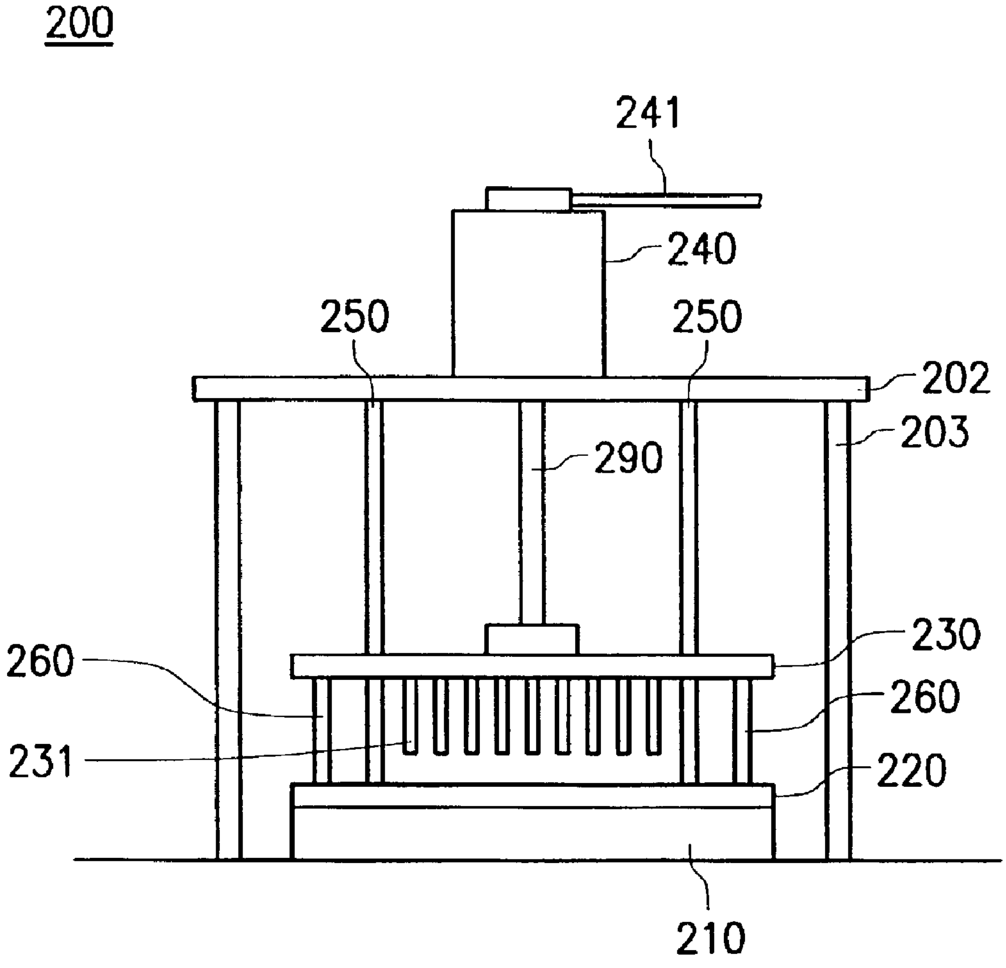
FIG. 6*a* is a front view depicting an apparatus, for punching CMP machine backing film, as disclosed in this invention.
Figure 6B:
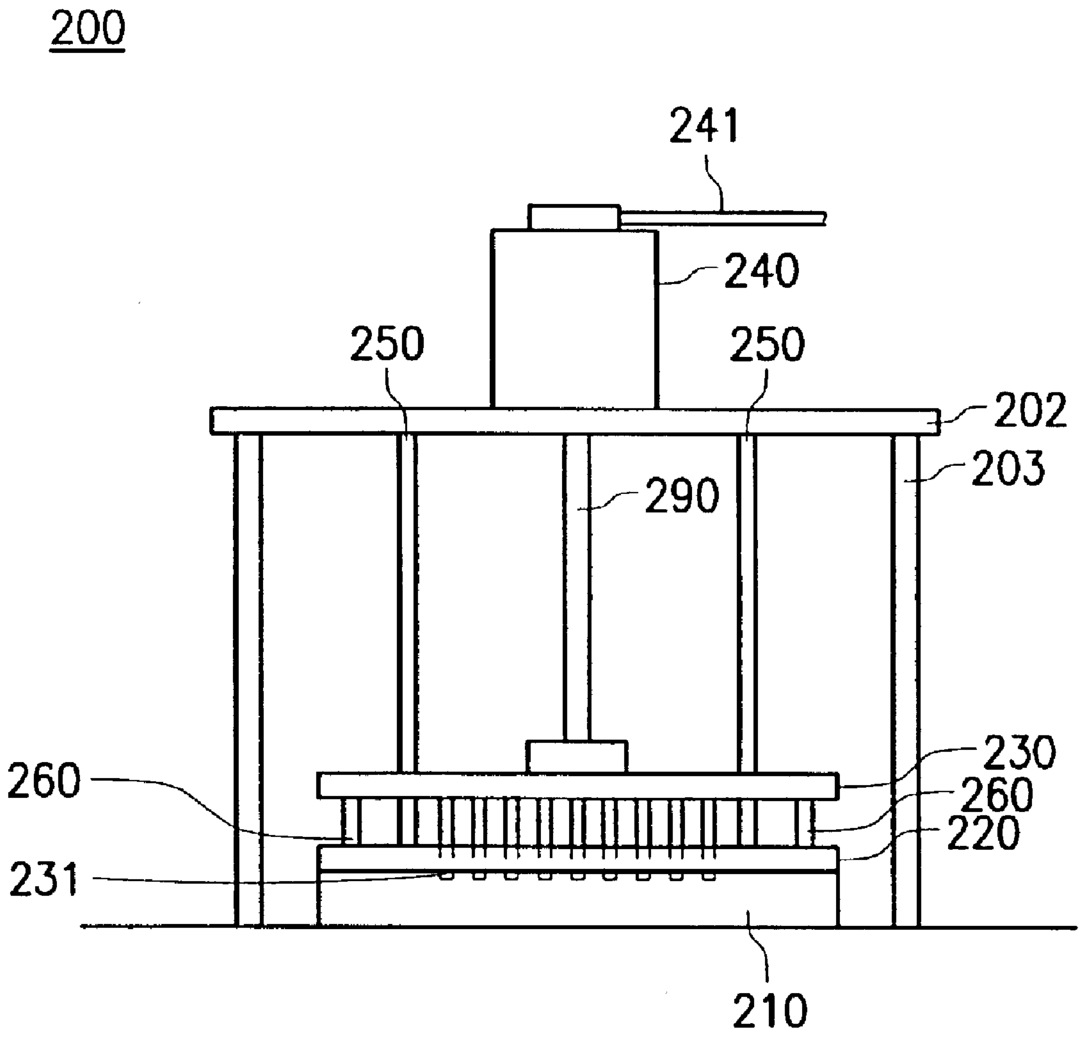
FIG. 6*b* is a front view depicting an apparatus, for punching CMP machine backing film, as disclosed in this invention, wherein a first plate is located at a second position, a second plate is located at a fourth position.

The first plate 220 is provided with a plurality of lead holes 221 and four first through holes 222 as shown in FIG. 5*b*. The first through holes 222 are used for the main rods 250 to pass through. Thus, the first plate 220 is disposed on the base 210 in a manner such that it moves between a first position as shown in FIG. 4 and a second position as shown in FIG. 6*b* along the main rods 250. The first plate 220 is idle at the first position; that is, the punching apparatus 200 is not actuated at this time. The first plate 220 abuts the backing-film at the second position.

Figure 5C:
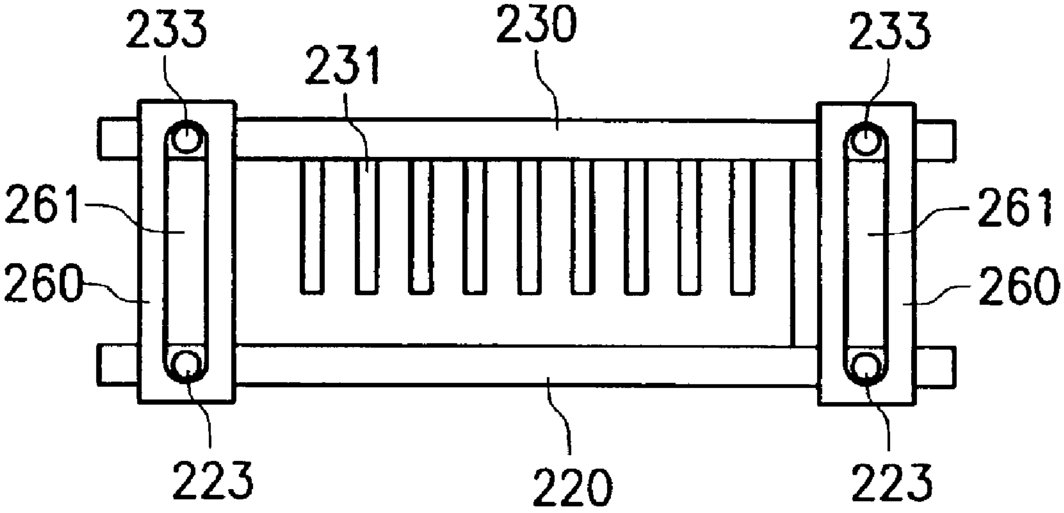
FIG. 5*c* is a schematic view depicting connecting members in FIG. 4.
Figure 5D:
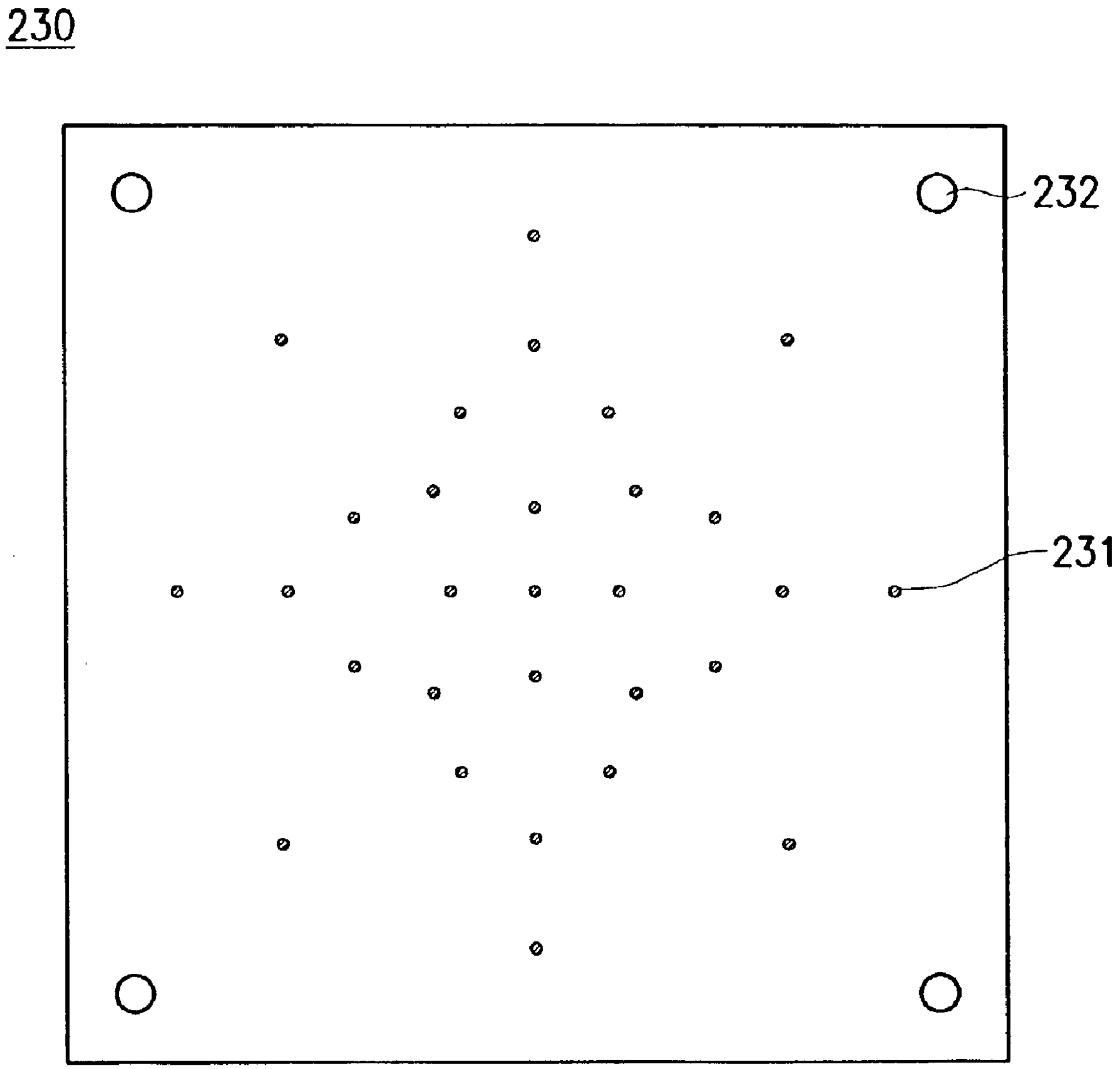
FIG. 5*d* is a top view depicting a second plate in FIG. 4.

The second plate 230 is provided with a plurality of punches 231 and four second through holes 232 as shown in FIG. 5*d*. Each of the punches 231 corresponds to the lead holes 221 of the first plate 220. Each of the second through holes 232 corresponds to the first through holes 222 of the first plate 220, and is used for the main rods 250 passing through. Thus, the second plate 230 is disposed on the base 210 in a manner such that it moves between a third position as shown in FIG. 4 and a fourth position as shown in FIG. 6*b* along the main rods 250. The second plate 230 is idle at the third position; that is, the punching apparatus 200 is not actuated at this time. The punches 231 of the second plate 230 pass through the first plate 220 to punch the backing-film at the fourth position. The first plate 220 is located at the first position when the second plate 230 is located at the third position. The first plate 220 is located at the second position when the second plate 230 is located at the fourth position.

The cylinder 240 is disposed on the platen 202, and connects with the second plate 230 through the actuating rod 290. The cylinder 240 moves the first plate 220 and the second plate 230. The main rods 250, disposed on the base 210, guide the movement of the first plate 220 and the second plate 230.

As shown in FIG. 5*c*, two connecting members 260 are disposed on both sides of the first plate 220 and the second plate 230 respectively. The connecting members 260 connect the first plate 220 and the second plate 230 in a manner such that the first plate 220 moves relative to the second plate 230. Specifically, each of the connecting members 260 is provided with an opening 261 for a first guiding member 223 of the first plate 220 and a second guiding member 233 of the second plate 230 to be inserted therein. Thus, the first plate 220 can move relative to the second plate 230 by the openings 261 of the connecting members 260.

The gas-supplying device 270 communicates with the cylinder 240 through a pipe 241, and supplies gas to the cylinder 240. The buttons 280 are electrically coupled to the gas-supplying device 270 through wires 281. The gas-supplying device 270 supplies gas to the cylinder 240 when the buttons 280 are actuated at the same time.

The backing-film preventive maintenance method, using the punching apparatus 200, is described as follows.

Figure 7:
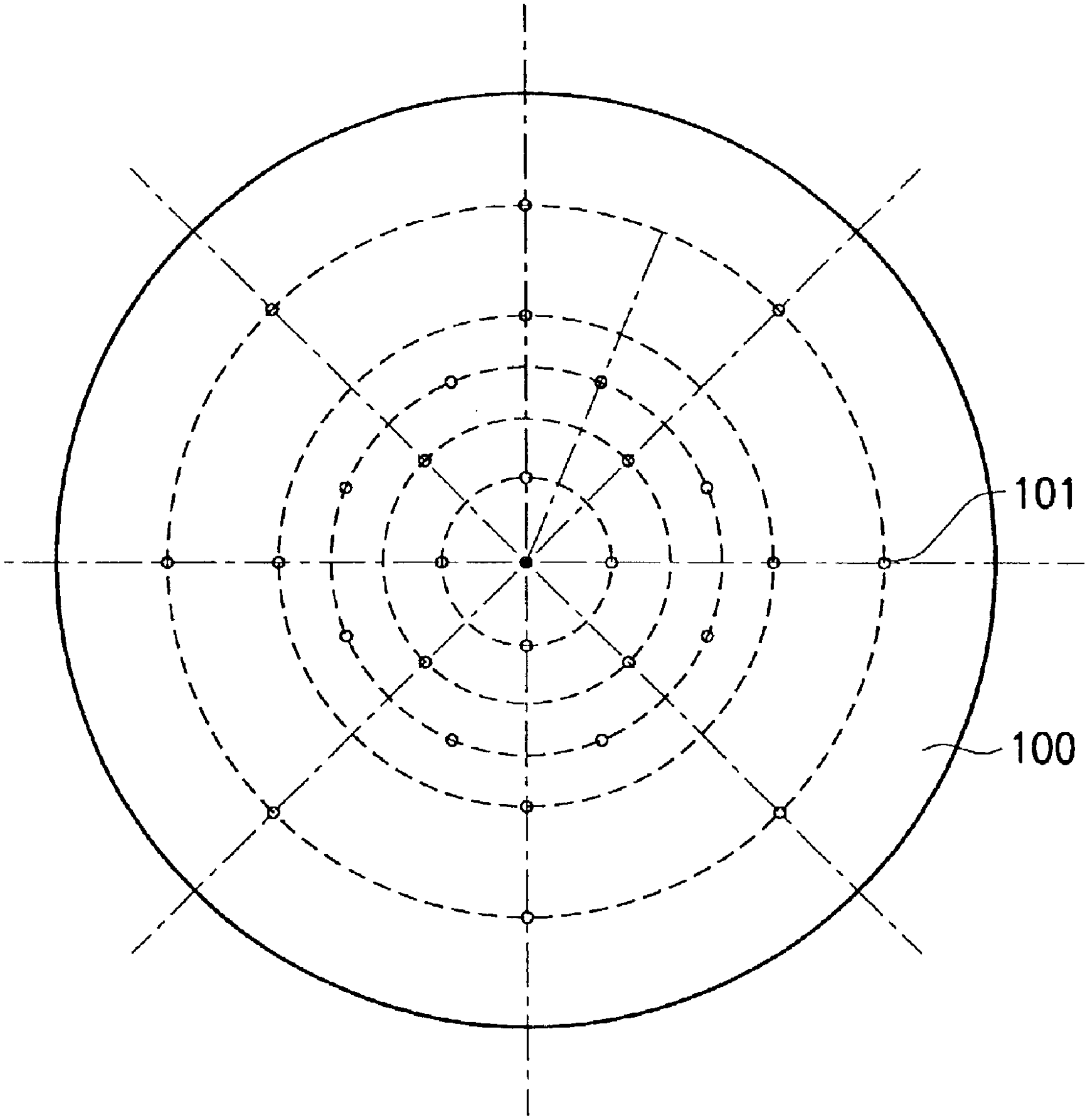
FIG. 7 is a top view depicting a backing-film, wherein holes on the backing-film are pre-drilled by the apparatus in FIG. 4.

Referring to FIG. 7, it is understood that a backing-film 100 to be drilled by the punching apparatus is the same as the backing-film as shown in FIG. 2*c*. The unused backing-film is covered by a paper. The difference between the conventional procedure and the backing-film preventive maintenance method of this invention is that the backing-film 100 is pre-drilled by the punching apparatus 200 to produce a plurality of holes 101 before it is assembled to the top ring in this invention. Thus, the process time is reduced, and the possibility of generating burrs is removed. Furthermore, referring to FIG. 7, the amount of the holes 101 is twenty-nine because it corresponds to the amount of the air holes of the used top ring. However, it is not limited to this.

Since the backing-film 100 is pre-drilled, the backing-film preventive maintenance method, using the punching apparatus 200, comprises the following steps. Firstly, the top ring 4 is disassembled from the shaft 1 before the preventive maintenance for the backing-film proceeds. The top ring 4 is cleaned after disassembling the guide ring 42 from the top ring 4 and removing the used backing-film. The new backing-film 100 is disposed on the top ring 4, wherein the backing-film 100 is pre-drilled by the punching apparatus 200. Finally, the guide ring 42 is assembled to the top ring 4, and the top ring 4 is assembled to the shaft 1.

Figure 8:
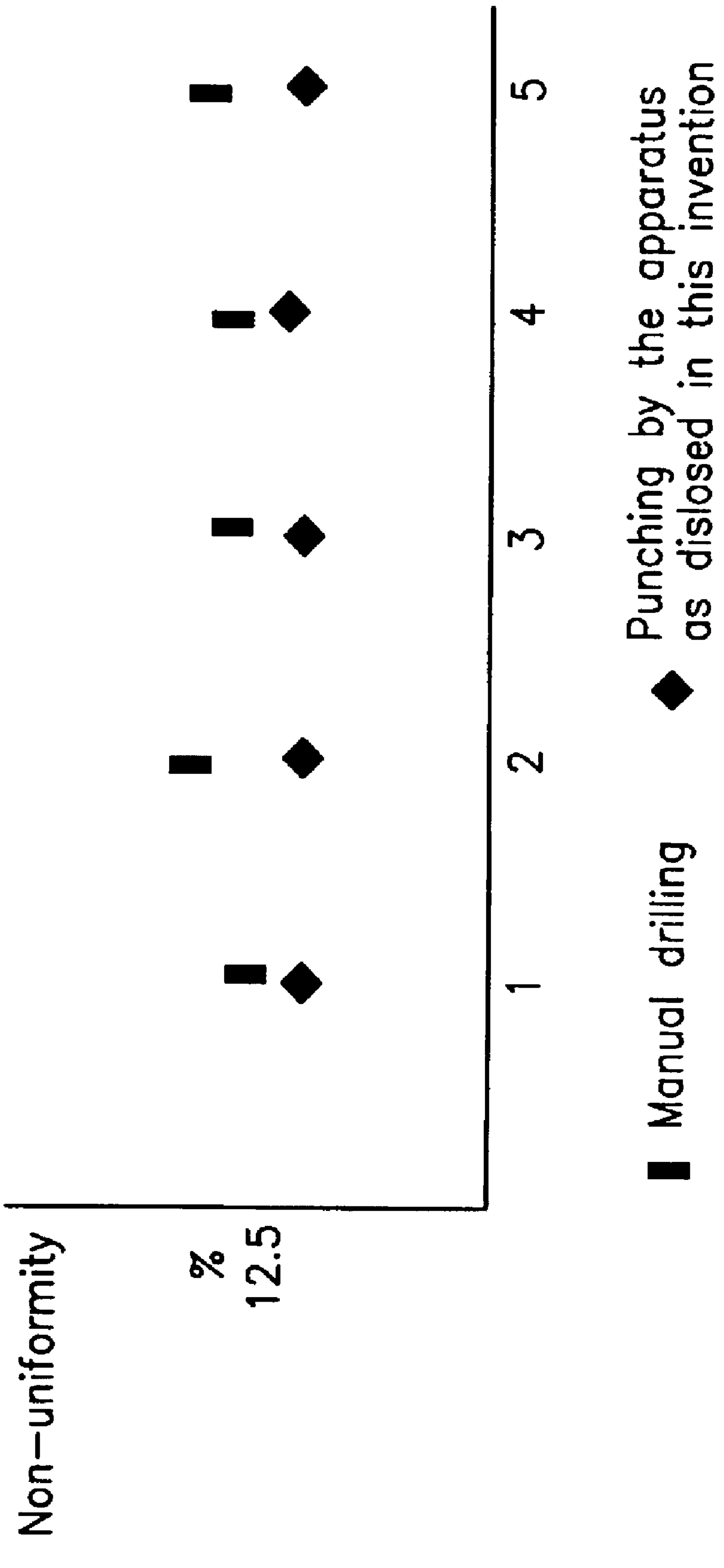
FIG. 8 is a diagram depicting the non-uniformity of the wafers disposed on backing-films by different replacements.

FIG. 8 is a comparison diagram that shows the non-uniformity of polished wafers. The rhombus represents wafers polished on the backing-film by the preventive maintenance method of this invention, and the rectangle represents wafers polished on the backing-film by the conventional method. Referring to FIG. 8, the uniformity of the wafers polished on the backing-film by the method of this invention is better than the conventional method.

As stated above, instead of manual drilling, the backing-film is drilled by the punching apparatus in this invention. Thus, the process time is reduced, and the stability of preventive maintenance is enhanced. As a result, the quality of preventive maintenance is enhanced, and the backing-film replacement is simplified.

In addition, the invention has considered that the backing-film may be pre-drilled by laser. However, the cost of laser equipment is very expensive. In view of cost, the punching apparatus of this invention is a better choice.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. An apparatus for punching CMP machine backing film, comprising:

a base for holding the backing-film;

a first plate disposed on the base in a manner such that it moves between a first position and a second position, wherein the first plate abuts the backing-film when it is located at the second position; and a second plate, having a plurality of punches, disposed on the base in a manner such that it moves between a third position and a fourth position, wherein the first plate is located at the first position when the second plate is located at the third position, and the first plate is located at the second position when the second plate is located at the fourth position so that the punches pass through the first plate to punch the backing-film.

2. The apparatus as claimed in claim 1, wherein the first plate is provided with a plurality of lead holes corresponding to the punches of the second plate.

3. The apparatus as claimed in claim 1, wherein the base is provided with a concave portion for the backing-film disposing thereupon.

4. The apparatus as claimed in claim 1, further comprising:

a cylinder, connecting with the second plate, for moving the first plate and the second plate; and a plurality of main rods, disposed on the base, for guiding the movement of the first plate and the second plate; and a plurality of connecting members connecting the first plate and the second plate in a manner such that the first plate moves relative to the second plate.

5. The apparatus as claimed in claim 4, wherein the first plate is provided with a plurality of first through holes, and the second plate is provided with a plurality of second through holes corresponding to the first through holes, and the main rods pass through the first through holes and the second through holes.

6. The apparatus as claimed in claim 4, wherein each of the connecting members is provided with an opening for connecting the first plate and the second plate.

7. The apparatus as claimed in claim 4, further comprising:

a gas-supplying device, communicating with the cylinder and supplying gas to the cylinder;

two buttons electrically coupled to the gas-supplying device, wherein the gas-supplying device supplies gas to the cylinder when the buttons are actuated at the same time; and an actuating rod connecting the cylinder and the second plate.

* * * * *